(12) United States Patent
Piccione et al.

(10) Patent No.: US 9,935,138 B2
(45) Date of Patent: Apr. 3, 2018

(54) ARTICLE COMPRISING A PHOTODIODE-SIDE INTEGRATED FUSE FOR AVALANCHE PHOTODETECTOR FOCAL PLANE ARRAY PIXELS AND METHOD THEREFOR

(71) Applicant: Princeton Lightwave, Inc., Cranbury, NJ (US)

(72) Inventors: Brian Piccione, Yardley, PA (US); Xudong Jiang, Princeton, NJ (US); Krys Slomkowski, Parlin, NJ (US); Mark Allen Itzler, Princeton, NJ (US)

(73) Assignee: Argo AI, LLC, Cranbury, NJ (US)

(*) Notice: Subject to any disclaimer, the term of this patent is extended or adjusted under 35 U.S.C. 154(b) by 0 days.

(21) Appl. No.: 15/391,550

(22) Filed: Dec. 27, 2016

(65) Prior Publication Data
US 2017/0250209 A1    Aug. 31, 2017

Related U.S. Application Data

(60) Provisional application No. 62/301,058, filed on Feb. 29, 2016.

(51) Int. Cl.
*H01L 27/144* (2006.01)
*H01L 23/58* (2006.01)
*H01L 31/02* (2006.01)
*H01L 31/0216* (2014.01)
*H01L 31/107* (2006.01)

(52) U.S. Cl.
CPC ......... *H01L 27/1446* (2013.01); *H01L 23/58* (2013.01); *H01L 31/02005* (2013.01); *H01L 31/02027* (2013.01); *H01L 31/02161* (2013.01); *H01L 31/107* (2013.01)

(58) Field of Classification Search
CPC ........................... H01L 23/62; H01L 27/1446
See application file for complete search history.

(56) References Cited

U.S. PATENT DOCUMENTS

2009/0109582 A1* 4/2009 Jack .................. H01H 85/046
361/56

* cited by examiner

*Primary Examiner* — Daniel Shook
(74) *Attorney, Agent, or Firm* — Kaplan Breyer Schwarz, LLP

(57) ABSTRACT

A scalable fuse design for individual pixels of a focal plane array of photodiodes comprises a fuse disposed on the upper surface of each photodiode in the array, wherein the fuse is situated proximal to a side of each photodiode. The fuse of each photodiode is electrically coupled to the active region thereof via a first bus and is electrically coupled to an ROIC via a second bus.

20 Claims, 7 Drawing Sheets

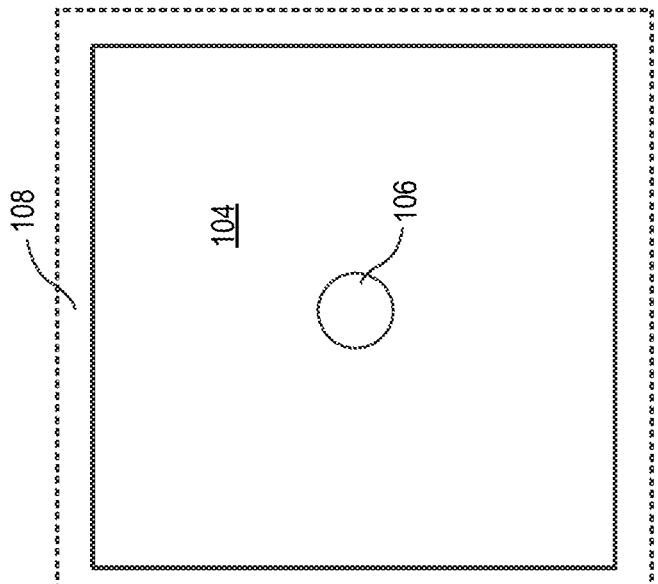
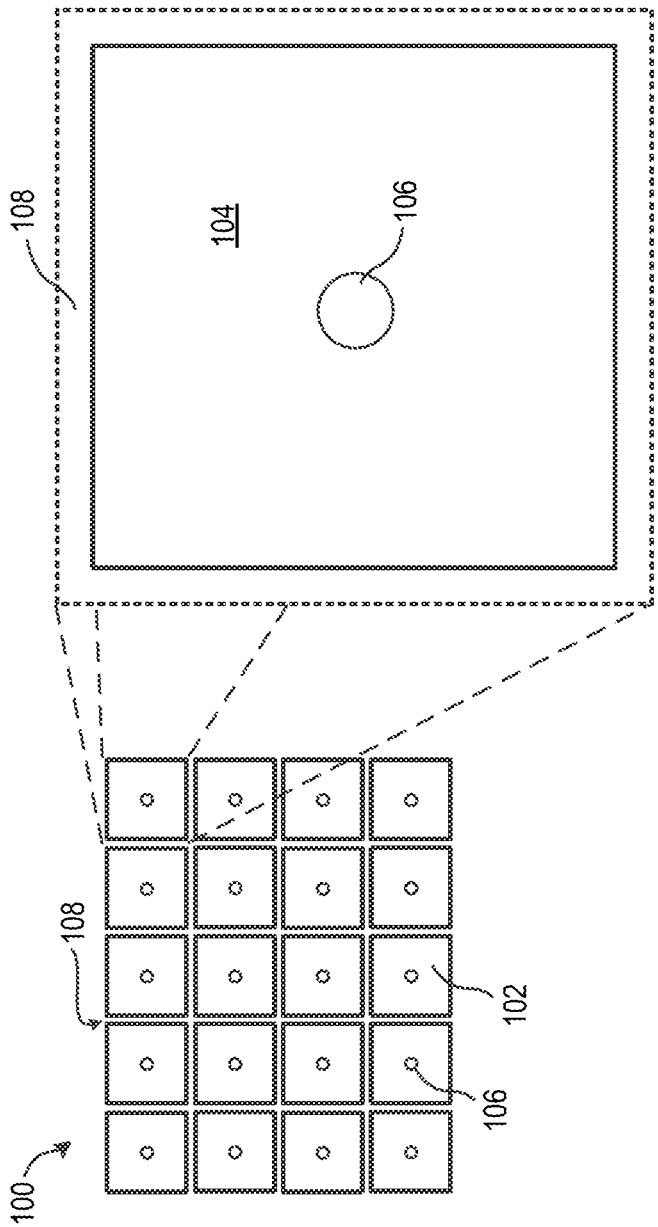

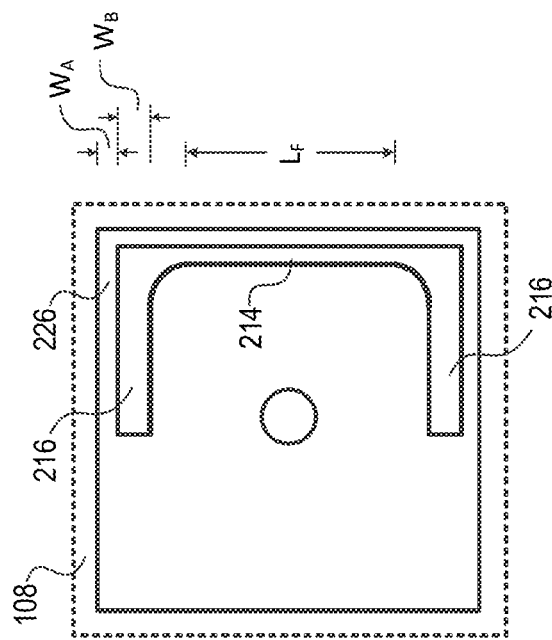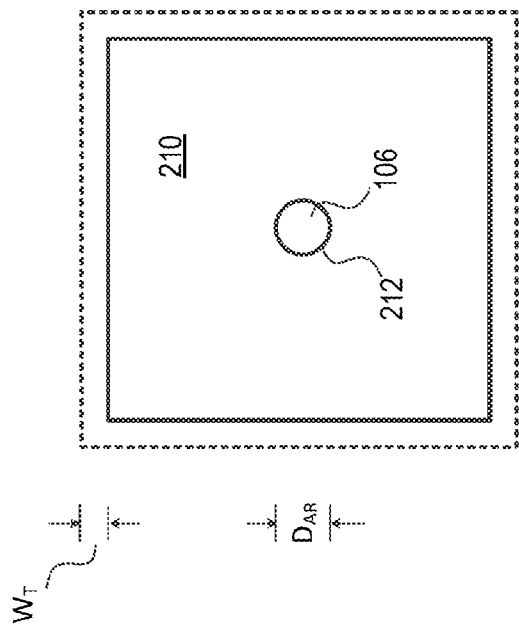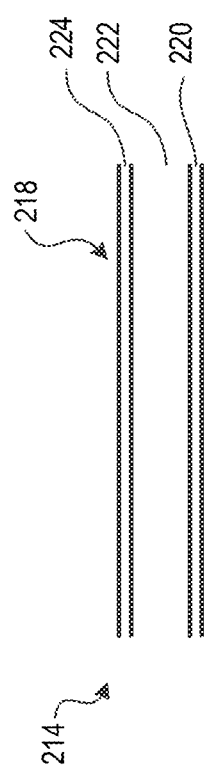

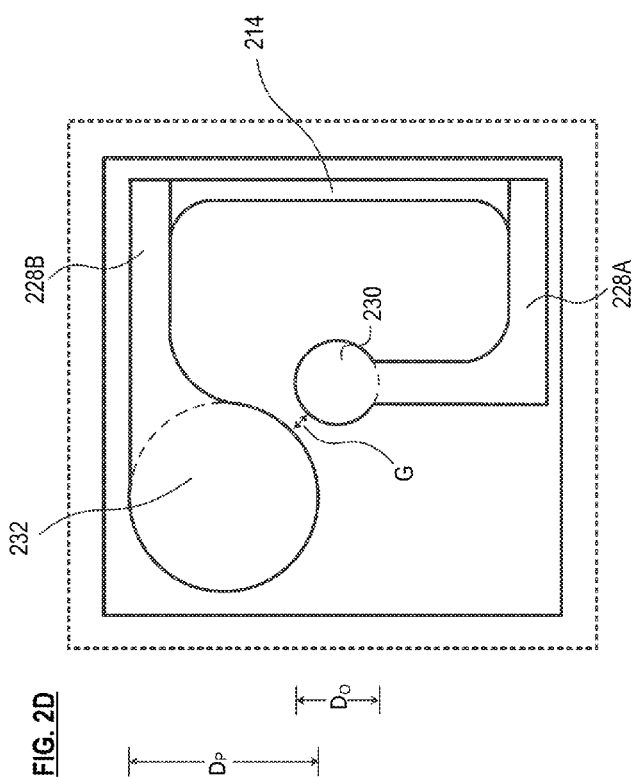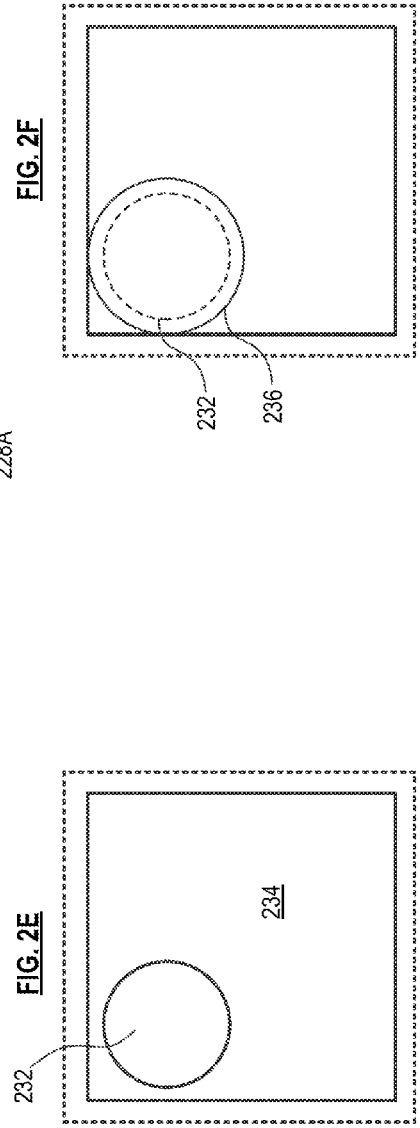

ARTICLE COMPRISING A PHOTODIODE-SIDE INTEGRATED FUSE FOR AVALANCHE PHOTODETECTOR FOCAL PLANE ARRAY PIXELS AND METHOD THEREFOR

STATEMENT OF RELATED CASES

This case claims priority of U.S. Pat. Appl. Ser. No. 62/301,058, filed Feb. 29, 2016 and which is incorporated by reference herein.

FIELD OF THE INVENTION

The present invention relates generally to Avalanche Photodetector Focal Plane Arrays.

BACKGROUND OF THE INVENTION

The successful operation of avalanche photodetector (APD) focal plane arrays is largely dependent upon all pixels producing sufficiently low current under no illumination. The necessary complexity of the read-out integrated circuit (ROIC) chips, which are typically flip-chip bonded to APD photodetector arrays (PDAs), places a premium on ROIC pixel real estate relative to that of ROICs used with conventional PDA technologies. This hinders individual pixel addressability and, in fact, APD PDAs are biased in parallel. Consequently, when individual pixels exhibit abnormally low impedance relative to their neighbors, these "leaky" pixels effectively short-circuit the entire FPA, preventing operation of the device.

The present state of materials processing technology is sufficient to produce working APD PDAs, but point defects leading to catastrophically leaky pixels remain frequent enough to limit device yield.

SUMMARY OF THE INVENTION

The present invention provides a scalable fuse design for the individual pixels of an APD FPA. In the illustrative embodiment, the fuse is disposed on the PDA side, integrated on the upper surface of each individual pixel. The fuses are designed so that their resistance is low enough to enable normal APD FPA operation, but high enough to ensure that the fuse melts in any pixel having problematically low impedance. The melted fuse permanently opens the electrical path of the faulty pixel, thereby isolating it, enabling the rest of the array to function normally.

The inventors recognized that, due to the fuse's length and extreme thinness (i.e., a few nanometers), it would be exceedingly problematic to fabricate a fuse having a uniform thickness on a PDA having a "bumpy" or otherwise non-uniform surface profile (e.g., depositing on a mesoscopically-rough surface, the presence of a mesa structure, etc.). As such, in accordance with embodiments of the invention, the PDA is fabricated to present an atomically flat surface for fuse formation, such as by epitaxial deposition. Furthermore, the inventors recognized that offsetting ROIC metal-bump placement on each pixel relative to the device active area enables the fuse to be positioned along one side of the pixel and electrically connected to the photodetector/ROIC with wide buses. This approach results in a fuse design that is scalable to square pixel pitches as small as 25 μm with commonly-available process technologies.

BRIEF DESCRIPTION OF THE DRAWINGS

FIG. 1A depicts a top view of a conventional 4×5, backside illuminated, APD PDA.

FIG. 1B depicts, in greater detail, a single pixel from the APD PDA of FIG. 1a.

FIGS. 2A through 2B and 2D through 2F depict a fabrication sequence for a photodiode-side integrated fuse for individual pixels in an APD PDA, in accordance with the illustrative embodiment of the present invention.

FIG. 2C depicts an embodiment of a layer structure for the integrated fuse.

DETAILED DESCRIPTION

Figure 3:
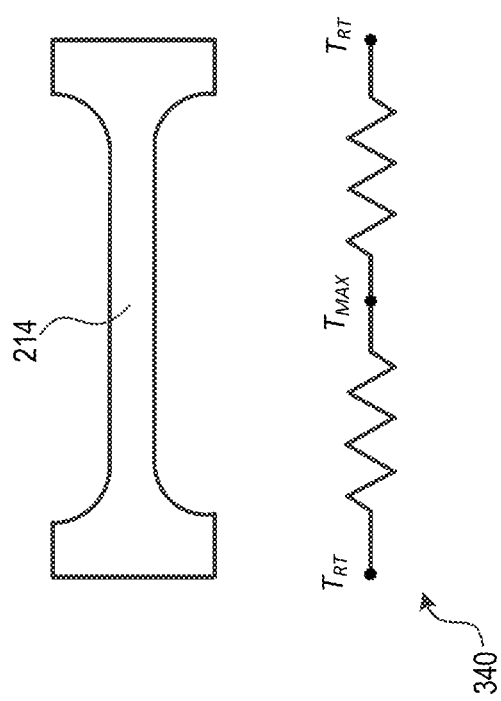
FIG. 3 depicts a thermal equivalent circuit model of the integrated fuse depicted in FIGS. 2B and 2C.

The following terms are defined for use in this disclosure and the appended claims:

A "photodiode focal plane array" comprises, among other elements, an array of photodiodes, an array of micro lenses for focusing photons onto the photodiodes in the area, a read-out integrated circuit ("ROIC").

A "photodiode array" comprises an array of photodiodes.

A "pixel" is a basic unit of an array. In the context of a photodiode array, the term "pixel" references a single photodiode of the array. In the context of a photodiode focal plane array, the term "pixel" collectively references a single photodiode in the photodiode array and a pixel in the ROIC, at a minimum. In the illustrative embodiment, there is a one-to-one correspondence between pixels in the photodiode array and pixels in the ROIC.

FIG. 1A depicts a top view of a conventional, backside illuminated, avalanche photodetector (APD) focal plane array 100. The exemplary array depicted in FIG. 1A comprises twenty pixels 102 in a 4×5 array. FIG. 1B depicts further detail of a single pixel 102 from array 100 of FIG. 1A.

As seen in these Figures, etched isolation trench 108 having an exemplary width of 6 microns separates each pixel 102. FIG. 1B depicts pixel 102 and a half width (i.e., 3 microns) of etched isolation trench 108.

An exemplary width of each pixel 102 is 50 microns. It is notable that active region 106 is centered within the pixel; this is important for limiting leakage currents. In the illustrative embodiment, surface 104 of pixel 102 comprises InP. In typical bump-bonded devices, active region 106 is coated with a metal film, and a metal bump is affixed concentrically to the top of this stack to enable bump-bonded contact with a CMOS ROIC.

FIGS. 2A through 2B and 2D through 2F depict a method for fabricating a photodiode-side integrated fuse for individual pixels 102 in an APD PDA, in accordance with the present teachings. Beginning with the basic pixel structure depicted in FIG. 1B, surface 104, which in the illustrative embodiment is InP, is coated with a passivating/insulating layer 210 in FIG. 2A. In some other embodiments, the avalanche photodiodes are based on other materials systems (i.e., materials other than InP). It is within the capabilities of those skilled in the art to adapt the present teachings to APD based on such other materials systems. In the illustrative embodiment, layer 210 comprises silicon nitride, $SiN_x$. $SiN_x$ may be deposited via a variety of processes, including plasma enhanced chemical vapor deposition (PECVD), inductively coupled plasma chemical vapor deposition (ICP CVD), reactive ion beam deposition (RIBD), or physical vapor deposition (PVD) (also known as "sputtering"). Opening 212 is patterned in layer 210 to keep active area 106 exposed. In some other embodiments, passivating/insulation layer 210 comprises $SiO_2$, although $SiN_x$ is generally preferred.

As depicted in FIG. 2B, fuse 214 is deposited along one edge of (each) pixel 102. In the illustrative embodiment, the fuse is deposited on the passivating/insulating layer of $SiN_x$. In some alternative embodiments, polyimide is spun on the $SiN_x$ (or $SiO_2$). As depicted in FIG. 2C, the fuse is embodied as stack 218 having multiple layers 220, 222, and 224 of metals, which are deposited as thin films. In the illustrative embodiment, stack 218 comprises thin-film layer 220 of titanium, thin-film layer 222 of aluminum over the titanium, and thin-film layer 224 of nickel over the aluminum. In the illustrative embodiment, layer 220 is used as an adhesion promoter (to layer 210) and layer 224 is used to prevent oxidation of the aluminum (i.e., layer 222). In some other embodiments, layer 220 is tantalum and/or layer 224 is chromium. In the illustrative embodiment, layer 222—aluminum—can be considered to be the primary fuse material. In some other embodiments, layer 222 is, without limitation, nickel, titanium, palladium, tin, platinum, germanium, or gold. Bus regions 216 extend from opposite ends of fuse 214 along opposed edges of pixel 102. In the illustrative embodiment, the width $W_B$ of buses 216 is 4 microns.

It is important that an apron or border region 226 having a minimum width of about one micron as measured between the "outer" edge of fuse 214 or buses 216 and the nearest edge of trench 108 is present. The border region ensures that the fuse will be deposited on a sufficiently flat surface and therefore not overlap the trench. The minimum width of about 1 micron between potentially interacting features is based on current photolithography mask registration tolerances. In the illustrative embodiment, the width $W_A$ of apron region 226 is 2 microns. With filet features, a 6-micron trench and 2-microns clearance on a 50-micron pitch pixel, the length $L_F$ of fuse 214 is about 25 microns.

As shown in FIG. 2D, buses 228A and 228B, which each comprise one or more layers of electrically conductive metal(s), such as titanium, platinum, and gold, extend from respective ends of fuse 214, being deposited over buses 216. Within buses 228A and 228B, the gold is primarily used to transport current. The titanium and platinum are used as diffusion barriers to prevent gold/indium from diffusing into the underlying InP of the APD. In an alternative embodiment, silver replaces gold as the primary current-transport layer and a tungsten/titanium alloy is used as the diffusion barrier. Alternatively, the upper layer of tungsten/titanium alloy is replaced by layers of titanium (40 nm), nickel (200 nm), and gold (100 nm). Bus 228A connects active region 106 (see, e.g., FIG. 2A) to fuse 214. Bus 228A terminates in circular portion 230 that overlies active region 106. In the illustrative embodiment, the diameter $D_O$ of circular portion 230 is 8 microns. Bus 228B extends to form conductive base or pad 230 for an offset metal bump for eventual connection to read-out circuitry (not depicted). In the illustrative embodiment, diameter $D_P$ of pad 232 is 18 microns. With the aforementioned dimensions, gap G between the circular portion 230 and pad 232 is 2 microns.

Per FIG. 2E, passivation/insulation layer 234 is deposited on top of all features except for pad 232. Passivation/insulation layer 234 is used to provide electrical and thermal insulation. For example, layer 234 further insulates the active-area bus (i.e., 228A/230) from direct contact with the ROIC-side bus (i.e., 228B/232). In the illustrative embodiment, layer 234 comprises SiNX. In other embodiments, other materials can suitably be used, such as and without limitation, polyimide and $SiO_2$.

Finally, per FIG. 2F, bump 236, which is comprises an electrically conductive material, such as indium, is affixed to the top of pad 232, enabling electrical connection between the photodiode 102 and the eventual bump-bonded CMOS circuitry (i.e., the ROIC). Other materials known to those skilled in the art may suitably be used in place of indium for bump 236. For example and without limitation, bump 236 can comprise: SnPb37, InAg, AuSn80/20, SnAg3.5, or Cu/CuSn pillars.

Specific layer thicknesses are dependent on desired fuse properties, which in turn are highly dependent on the choice of fuse material and in-depth knowledge of the underlying APD technology. The inventors have learned, from their own implementation of APD cameras, that with the inclusion of a safety margin, fuses will need to carry up to 1 mA current without adverse reaction for normal operation. However, current ROIC implementations begin to malfunction at the array level beyond 15 mA of applied current. Based on results from finite-element analysis, the inventors determined that thin-film fuses can effectively be treated as thermally insulted from their surroundings when integrated on substrates with substantially lower thermal conductivities. Highly electrically- and thermally-conductive fuse materials surrounded by material of a lower electrical and thermal conductivity will allow for a build-up of heat in the fuse before dissipation, enabling the temperature at the center of the fuse to be calculated using a two-element equivalent thermal circuit. FIG. 3 depicts equivalent circuit 340 for the illustrative fuse implementation.

Because the fuse can be treated as though it is surrounded by a perfect thermal insulator for the duration of its joule heating, the maximum temperature $T_{max}$ will be reached in its center. The thermally conductive path length to thermal "ground" is therefore equal to L/2, where L is the total length of the fuse.

In this implementation, the thermal equivalent circuit is governed by:

$$PR_\Theta = (T_{max} - T_{RT}) \quad [1]$$

where:
P is heat flow;
$R_\Theta$ is the thermal resistance; and
$T_{RT}$ is the temperature of the fuse at its end points.
With the length of the thermally conductive path to thermal ground equal to L/2, the equation governing the temperature difference between the center of the fuse and its end points is thus:

$$T_{max} - T_{RT} = \frac{P(L/2)}{\kappa A} \quad [2]$$

where:
K is thermal conductivity; and
A is the cross-sectional area.
In the case of joule heating, $P=I^2R$, where: P is power, I is current, and R is the total electrical resistance of the fuse. Using $R=\rho L/A$, where $\rho$ is electrical resistivity, and recognizing that the melting point, thermal conductivity, and electrical resistivity are determined by the choice of fuse material, the necessary length-to-area ratio of the fuse can be expressed as a function of prescribed electrical current and fuse material:

$$L/A = \sqrt{2\frac{\Delta T \kappa}{I^2 \rho}} \quad [3]$$

where:
$\Delta T = (T_{melt} - T_{RT})$
$T_{melt}$ is the melting point of the fuse material.

Ideally, a thin-film fuse is relatively straightforward to fabricate (i.e., on a flat surface), with a lower melting point, higher thermal conductivity, and lower electrical resistivity than its surroundings. Using aluminum as an example, having a melting point of 993 K, a thermal conductivity of 205 W/m·K, and an electrical resistivity of $2.82 \times 10^{-8}$ Ω·m, and with a desired current in the range of about 1 to about 15 mA, a desired L/A ratio is in the range of about $3.2 \times 10^9$ to about $2.1 \times 10^8$ m$^{-1}$. Using a practical minimum for area dimensions, a fuse thickness of five nanometers (nm) and a fuse width of 0.25 microns, a minimum range of necessary fuse lengths in the range of about 0.3 to about 4 microns is obtained. Allowing for some margin on thickness and/or width, the length requirement increases, emphasizing a need to design a layout that maximizes available length for the fuse.

Figure 4:
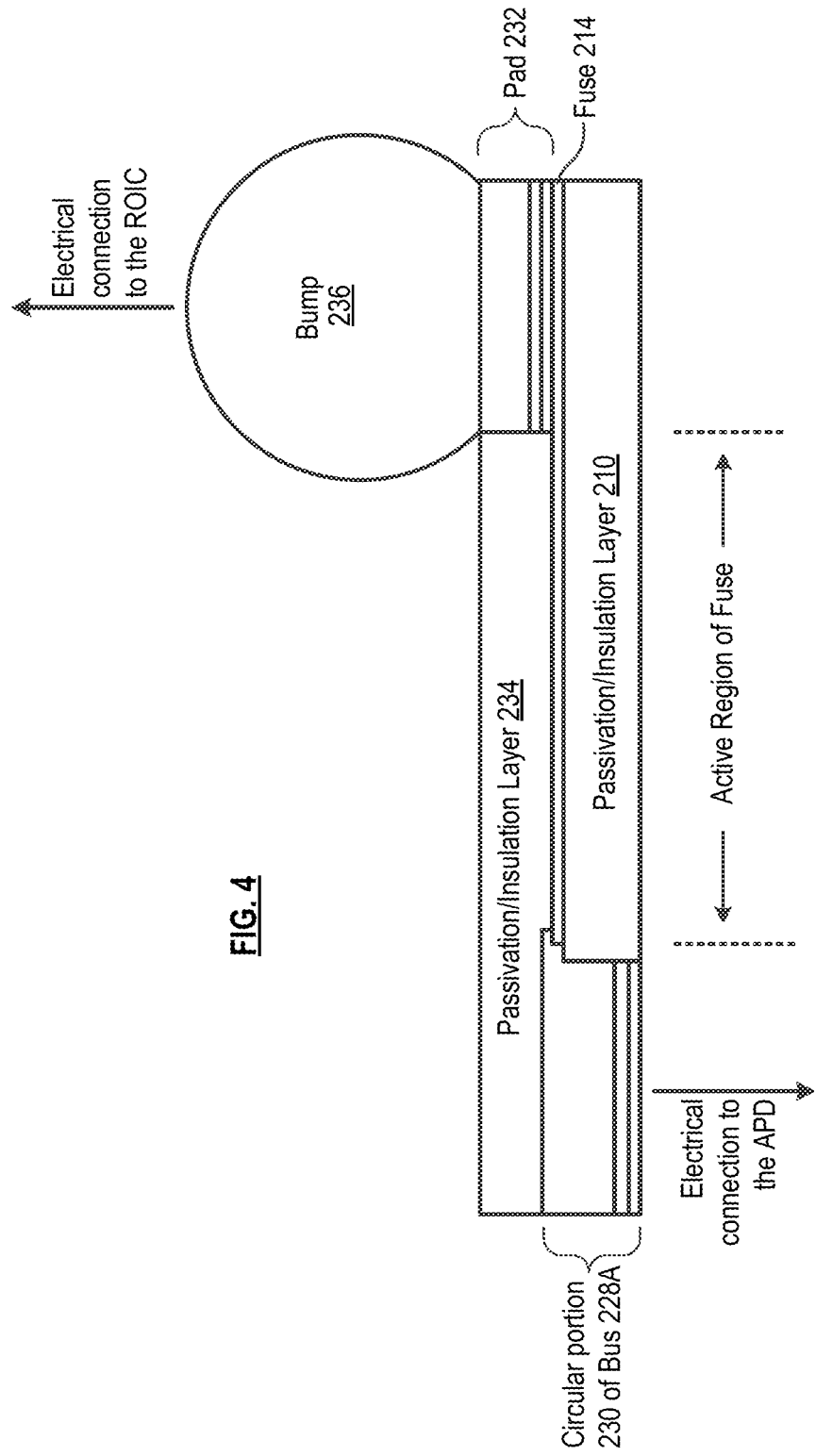
FIG. 4 depicts a truncated, schematic-level cross-sectional view of the fully integrated fuse.
Figure 5:
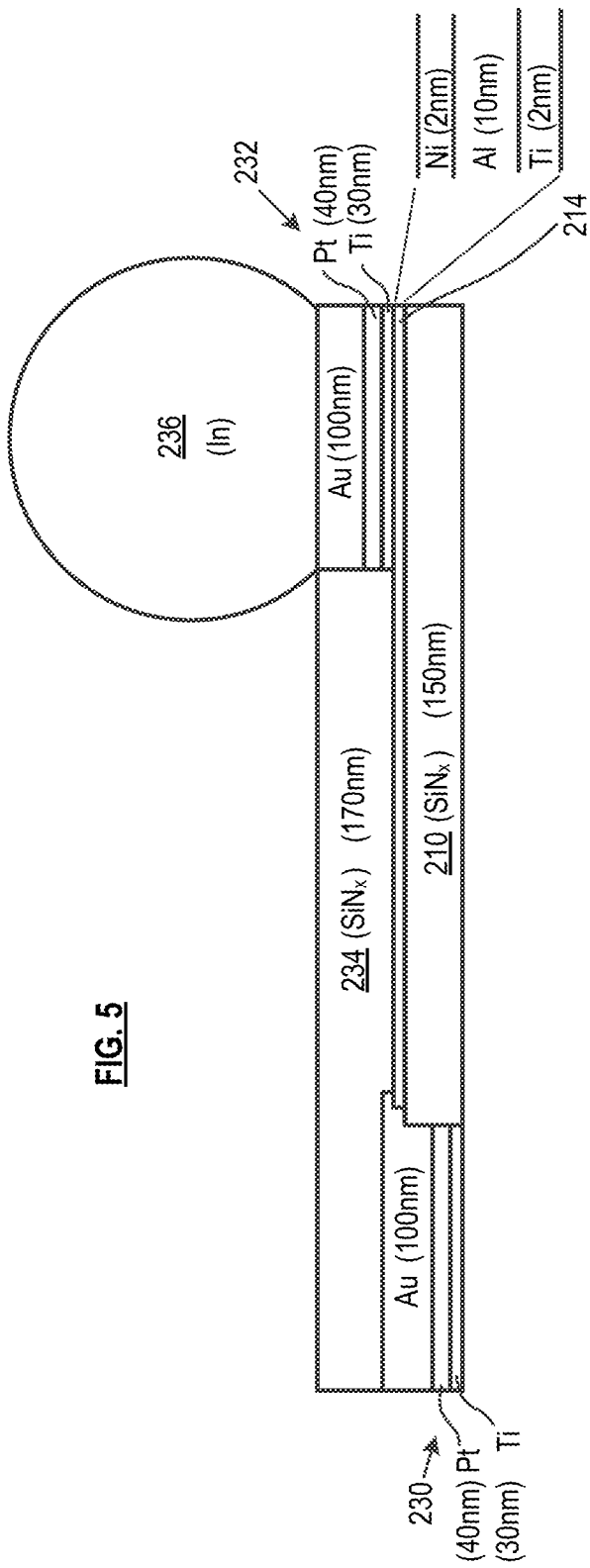
FIG. 5 depicts the fully integrated fuse shown in FIG. 4 with materials and dimensions for an exemplary embodiment.

FIGS. 4 and 5 depict an exemplary integrated fuse 214 in cross-section (see also, FIG. 2C), with FIG. 5 depicting exemplary materials and layer thicknesses.

In the illustrative embodiment, fuse comprises aluminum, deposited to a thickness of about 10 nm. A very thin layer of titanium is used as an adhesive layer between passivation/insulation layer 210 (e.g., silicon nitride, etc.) and the aluminum. The titanium must be thick enough to enable adhesion between the underlying substrate and the fuse material. In the illustrative embodiment, a thickness of 2 nm was sufficient. In other embodiments in which a different substrate is used, a slightly thicker layer might be required to produce a flat, cohesive adhesion film. A thickness in the range of about 2 to 10 nm is expected to be sufficient for most substrates. However, one skilled in the art can readily verify the thickness requirement via simple experimentation. A very thin layer of nickel is deposited on the aluminum to protect the fuse against aluminum oxidation. The capping layer of nickel must be thick enough to prevent oxygen transport to the fuse. A layer of nickel having a thickness of 2 nm was determined by experimentation to be sufficient for this purpose. If a different material is used for as the capping layer, a different thickness might be required to prevent oxygen transport. In such situations, those skilled in the art will be able to determine the required thickness via simple experimentation.

The bus metals (titanium, platinum, and gold in the illustrative embodiment) of circular portion 230 of bus 228A provide electrical connection to the APD (at the left in FIGS. 4 and 5) and the bus metals of pad 232 of bus 228B provides electrical connection to the ROIC (at the right in FIGS. 4 and 5). In the illustrative embodiment, buses 228A and 228B comprise a layer of titanium having a thickness of 30 nm, a layer of platinum having a thickness of 40 nm on top of the titanium, and a layer of gold having a thickness of 100 nm on top of the platinum. The aforementioned layer thicknesses are for the illustrative embodiment. For all such layers, there is a minimum thickness that must be exceeded in order to ensure that the layer, as deposited, contains no pinholes that reach to the underlying layer. That minimum is about 10 nm. There is no particular maximum thickness; the maximum is bounded by the specifics of other depositions in the overall process. An upper bound for the thickness of the titanium and platinum layers is about 100 nm for each layer. An upper bound for the thickness of the gold layer is about 1 micron.

In the illustrative embodiment, passivation/insulation layer 210 comprises silicon nitride having a thickness of 150 nm and passivation/insulation layer 234 comprises silicon nitride having a thickness of about 170 nm. Once again, the aforementioned layer thicknesses are for the illustrative embodiment. As previously discussed, there is a minimum thickness that must be exceeded in order to ensure that the layer, as deposited, contains no pinholes that reach to the underlying layer. And the maximum is bounded by the specifics of other depositions in the overall process. A range for the thickness of these layers is typically between about 10 nm and about 1 micron. In the illustrative embodiment, lower layer 210 must be thinner than bus 228A (i.e., the stack of Ti+Pt+Au), which is 170 nm. Hence, a thickness of 150 nm was selected for layer 210). And upper layer 234 is ideally about the same thickness as bus 228B. Hence, a thickness of 170 nm was selected for layer 234.

Figure 6B:
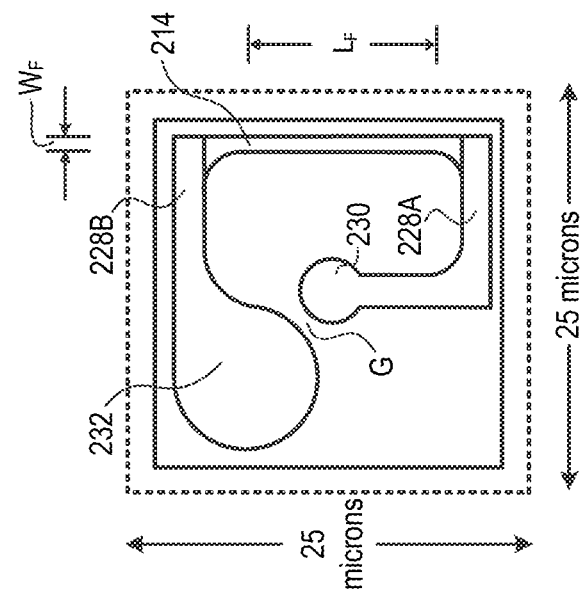
FIGS. 6A and 6B depict the scalable nature of fuses in accordance with the present invention.
Figure 6A:
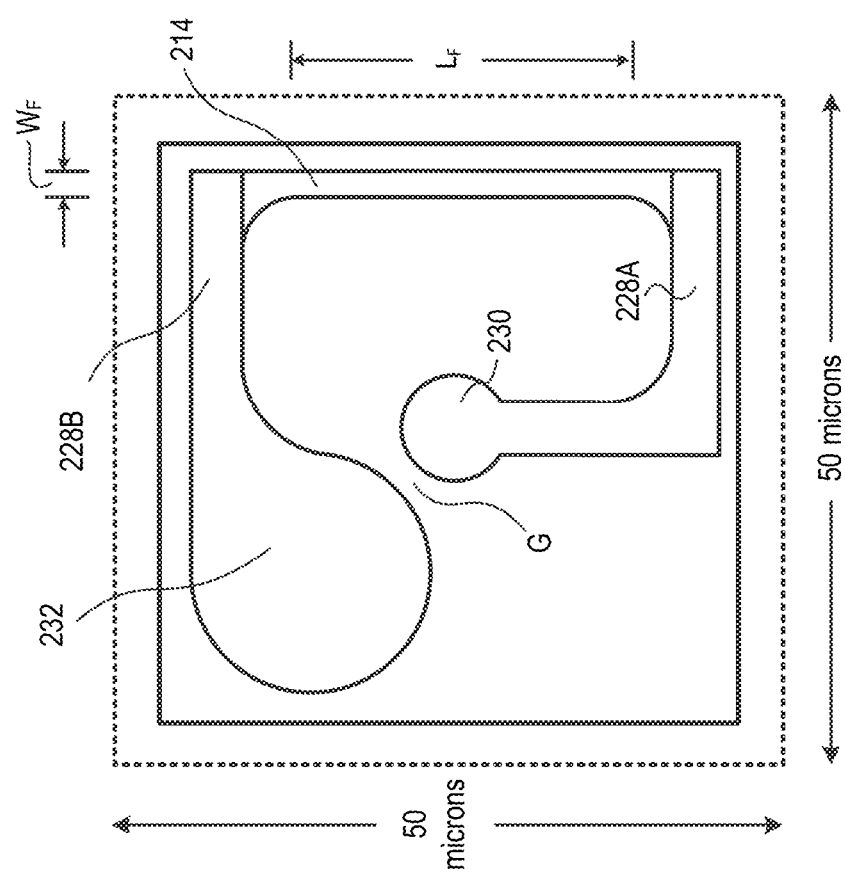

FIGS. 6A and 6B depict how, with the aforementioned reasonable fabrication limits on trace deposition, the design is readily scalable to a PDA with 25 micron pitch. The resistance of the fuse can be kept within the design range at shorter fuse lengths by reducing its width. For example, for a PDA having a plurality of pixels with a 50 micron pitch, the fuse length $L_F$ is about 25 microns and fuse width $W_F$ is 2 microns. For a PDA having a plurality of pixels with a 25 micron pitch, the fuse length $L_F$ is about 6.5 microns and fuse width $W_F$ is 0.5 microns. It is expected that for most applications, fuse length $L_F$ will be in the range of about 1 micron to 30 microns.

The following guidelines are provided for the scalable design:
  a minimum 1 micron clearance between fuse and pixel isolation trench;
  a minimum 2 micron clearance between the two Ti/Pt/Au circular regions;
  SiN$_x$ covers the fuse and the central Ti/Pt/Au deposition to ensure electrical isolation from bump 236 (providing connection to the ROIC);
  a minimum 1 micron trench width;
  a minimum bus width-to-fuse width ratio of 2; and
  a minimum filet radius of curvature equal to bus width.
Acceptable margins between critical features can be maintained down to a pixel pitch of about 25 microns.

It is to be understood that the disclosure teaches just one example of the illustrative embodiment and that many variations of the invention can easily be devised by those skilled in the art after reading this disclosure and that the scope of the present invention is to be determined by the following claims.

What is claimed:

1. A method comprising:
  forming an array of photodiodes, wherein at least some of the photodiodes in the array are formed to have an upper surface that is atomically flat;
  depositing a first passivating/insulating layer on said some photodiodes;
  depositing a metal stack on a portion of the passivating/insulating layer of each of said some photodiodes, wherein the metal stack comprising plural layers of different metals, and wherein:

(a) a first portion of the metal stack defines a fuse having a first end and a second end,
(b) a second portion of the metal stack extends beyond the first end of the fuse, and
(c) a third portion of the metal stack extends beyond a second end of the fuse;
depositing a first bus on the second portion of the metal stack, wherein the first bus electrically couples the fuse to an active region of the photodiode;
depositing a second bus on the third portion of the metal stack, wherein the second bus terminates in a pad that receives a metal bump for electrical connection with read-out circuitry for the array of photodiodes; and
depositing, on each of said some photodiodes, a second passivating/insulating layer except for on the pad.

2. The method of claim 1 wherein depositing a metal stack further comprises depositing the first portion of the metal stack proximal to a first edge of each of said some photodiodes.

3. The method of claim 2 wherein depositing a metal stack further comprises depositing the second portion of the metal stack proximal to a second edge of each of said photodiodes and depositing the third portion of the metal stack proximal to a third edge of each of said photodiodes.

4. The method of claim 1 wherein depositing a second bus stack further comprises disposing the pad in a location on the photodiode that is off-center.

5. The method of claim 1 wherein the metal stack comprises aluminum.

6. The method of claim 1 wherein a length of the fuse is in a range of about 6.5 microns to about 25 microns.

7. The method of claim 1 wherein a length of the fuse is in a range of about 1 micron to about 30 microns.

8. The method of claim 1 and further wherein the first portion of the stack comprises an adhesion promoter and an oxidation barrier.

9. The method of claim 8 wherein the adhesion promoter is titanium.

10. The method of claim 8 wherein the oxidation barrier is nickel.

11. The method of claim 1 wherein the metal stack comprises a metal selected from the group consisting of aluminum, nickel, titanium, palladium, tin, platinum, germanium, and gold.

12. A method comprising:
forming an array of photodiodes;
depositing a metal stack over a portion of at least some of the photodiodes, wherein:
(a) a first portion of the metal stack defines a fuse having a first end and a second end,
(b) a second portion of the metal stack extends beyond the first end of the fuse, and
(c) a third portion of the metal stack extends beyond a second end of the fuse;
depositing a first bus on the second portion of the metal stack, wherein the first bus electrically couples the fuse to an active region of the photodiode; and
depositing a second bus on the third portion of the metal stack, wherein the second bus terminates in a pad that receives a metal bump for electrical connection with read-out circuitry for the array of photodiodes.

13. The method of claim 12 wherein depositing the metal stack further comprises depositing the first portion of the metal stack along an edge of the photodiode.

14. The method of claim 13 wherein depositing a metal stack further comprises providing a gap between an outer edge of the first portion of the metal stack and an isolation trench that the edge of the photodiode.

15. The method of claim 14 wherein the gap is at least 1 micron.

16. The method of claim 12 wherein depositing the metal stack further comprises depositing plural layers of metal, each deposited as a thin film.

17. The method of claim 12 wherein the metal stack comprises aluminum.

18. The method of claim 12 wherein the metal stack comprises an adhesion promoter, an oxidation barrier, and a metal selected from the group consisting of aluminum, nickel, titanium, palladium, tin, platinum, germanium, and gold.

19. The method of claim 12 wherein depositing a second bus further comprises positioning the pad so that it is offset relative to an active area of the photodiode.

20. The method of claim 12 wherein the photodiodes are avalanche photodiodes.

* * * * *